(12) United States Patent
Takeuchi et al.

(10) Patent No.: US 8,153,487 B2
(45) Date of Patent: Apr. 10, 2012

(54) SEMICONDUCTOR DEVICE AND METHOD FOR MANUFACTURING THE SAME

(75) Inventors: Wakako Takeuchi, Yokohama (JP); Hiroshi Akahori, Yokohama (JP); Murato Kawai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 100 days.

(21) Appl. No.: 12/659,482

(22) Filed: Mar. 10, 2010

(65) Prior Publication Data

US 2010/0184275 A1    Jul. 22, 2010

Related U.S. Application Data

(62) Division of application No. 11/699,501, filed on Jan. 30, 2007, now abandoned.

(30) Foreign Application Priority Data

Jan. 31, 2006    (JP) .................................. 2006-023851

(51) Int. Cl.
*H01L 21/336* (2006.01)
*H01L 21/4763* (2006.01)
*H01L 21/44* (2006.01)

(52) U.S. Cl. ........ 438/257; 438/258; 438/587; 438/593; 438/630; 438/648; 257/E21.613; 257/E21.636; 257/E21.645

(58) Field of Classification Search ............ 257/E21.613, 257/E21.636, E21.645

See application file for complete search history.

(56) References Cited

U.S. PATENT DOCUMENTS

| 5,889,305 | A | 3/1999 | Choi et al. | |
| 7,462,905 | B2* | 12/2008 | Imai et al. | 257/316 |
| 2002/0008275 | A1* | 1/2002 | Nakagawa | 257/314 |
| 2004/0038492 | A1 | 2/2004 | Okazaki et al. | |
| 2005/0029576 | A1* | 2/2005 | Matsuno et al. | 257/314 |
| 2006/0237770 | A1* | 10/2006 | Huang et al. | 257/315 |
| 2007/0218606 | A1* | 9/2007 | Ozawa et al. | 438/165 |
| 2009/0072295 | A1* | 3/2009 | Kim | 257/321 |

FOREIGN PATENT DOCUMENTS

JP    2-188969    7/1990

(Continued)

OTHER PUBLICATIONS

Quirk et al. (Quirk, M., & Serda, J., (2001). Semiconductor Manufacturing Technology. Upper Saddle River, New Jersey: Pearson Educational International. pp. 309-311).*

(Continued)

*Primary Examiner* — Mohsen Ahmadi
(74) *Attorney, Agent, or Firm* — Finnegan, Henderson, Farabow, Garrett & Dunner, L.L.P.

(57) ABSTRACT

A semiconductor device includes a semiconductor substrate, a first insulating film provided on the semiconductor substrate, a charge storage layer provided on the first insulating film, a second insulating film comprising a plurality of insulating films provided on the charge storage layer and comprising a nitride film as an uppermost layer, and a single-layer control gate electrode provided on the second insulating film and comprising metal silicide.

4 Claims, 9 Drawing Sheets

FOREIGN PATENT DOCUMENTS

| | | |
|---|---|---|
| JP | 07-183411 | 7/1995 |
| JP | 8-204032 | 8/1996 |
| JP | 2-670330 | 10/1997 |
| JP | 2003-037190 | 2/2003 |
| JP | 2003-197781 | 7/2003 |
| JP | 2005-276428 | 6/2005 |
| JP | 2005-191489 | 7/2005 |
| JP | 2005-310990 | 11/2005 |
| JP | 2006-24738 | 1/2006 |

OTHER PUBLICATIONS

Notice of Reasons for Rejection issued by the Japanese Patent Office in copending application No. 2006-023851, mailed Nov. 29, 2010, and English language translation thereof.

Machine Translation of JP 2-670330.

Final Notice of Rejection issued by the Japanese Patent Office on Jul. 5, 2011, for Japanese Patent Application No. 2006-023851, and English-language translation thereof.

* cited by examiner

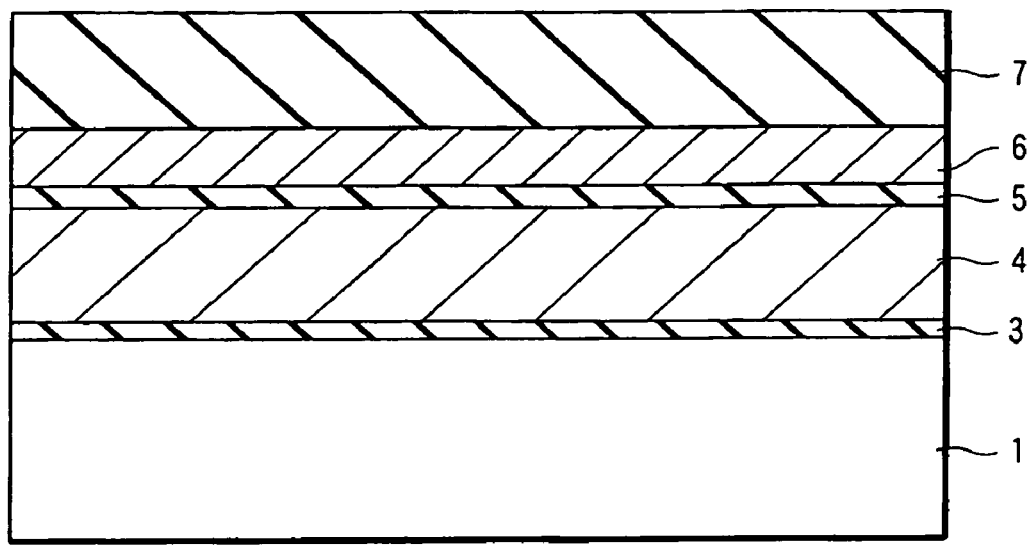
F I G. 5
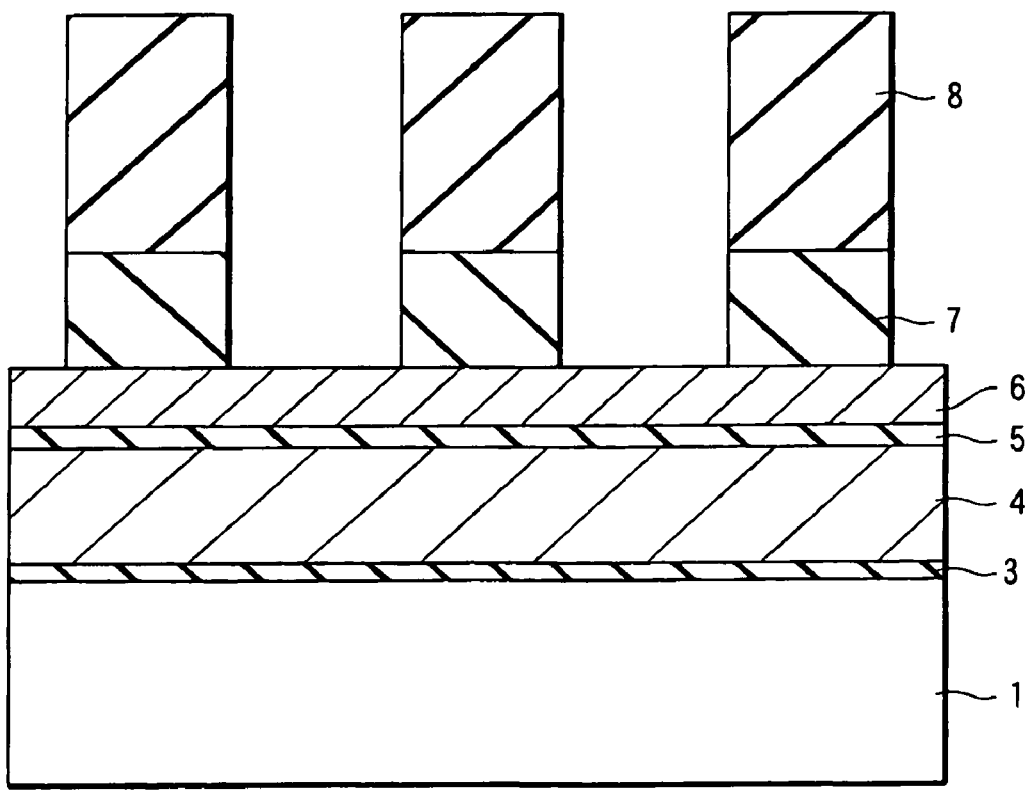
F I G. 6

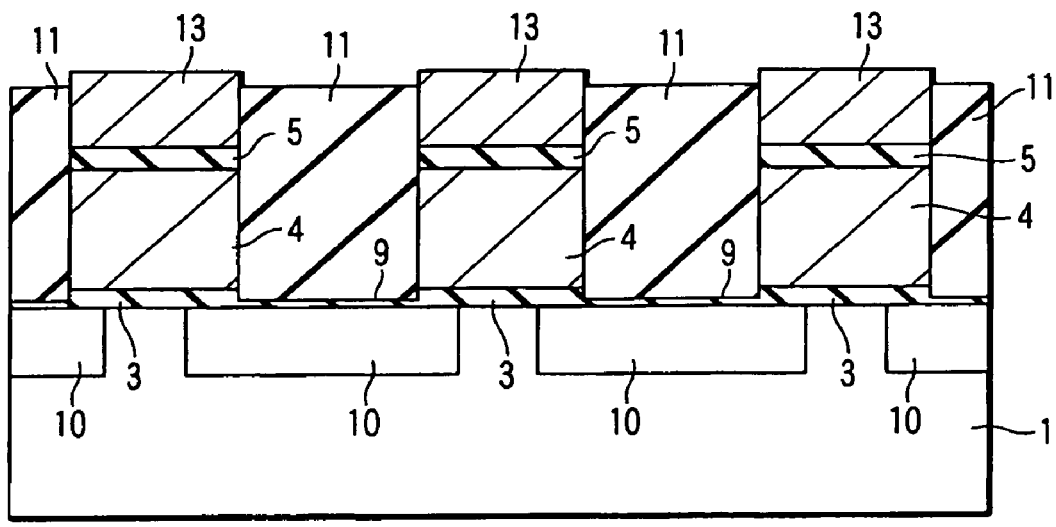
F I G. 11
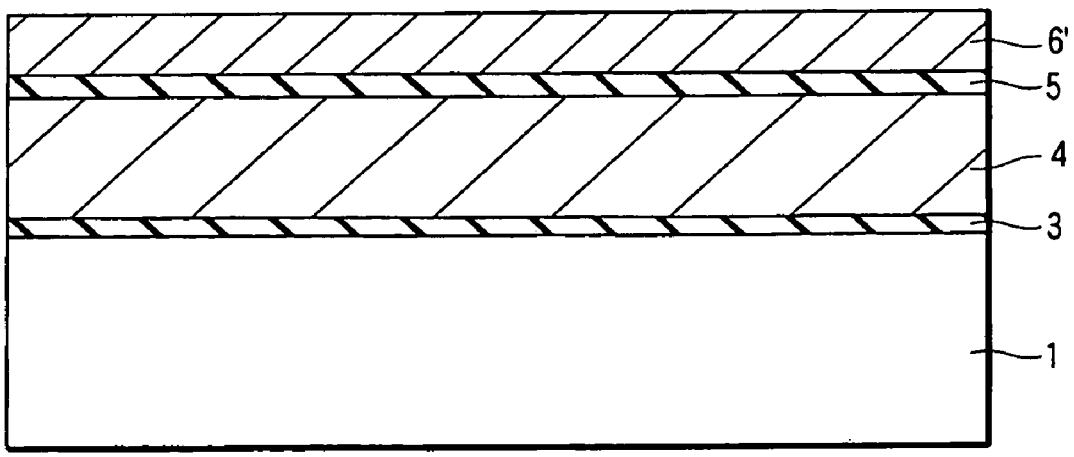
F I G. 12

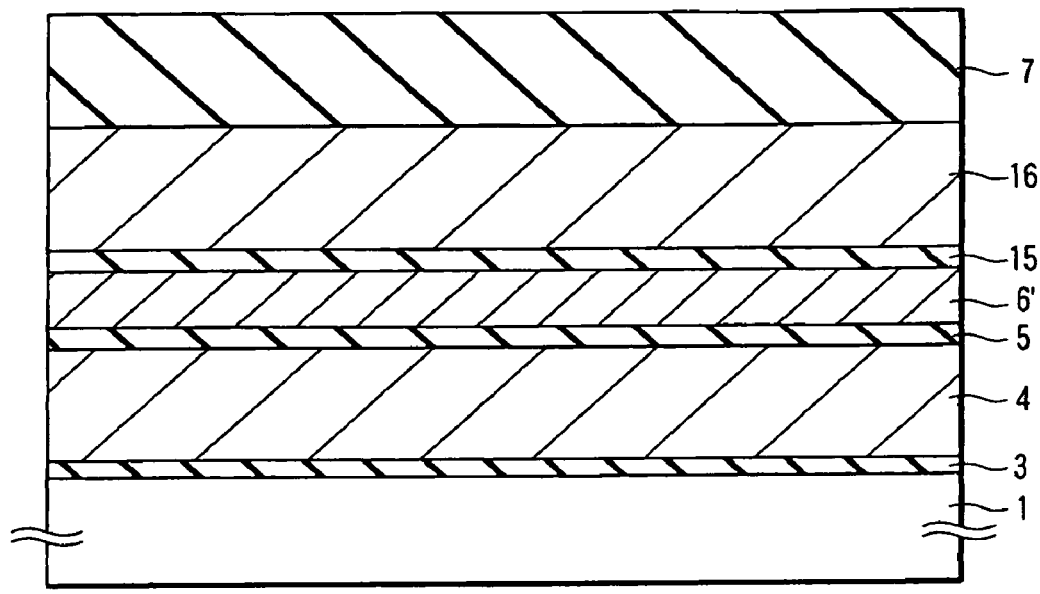
F I G. 13
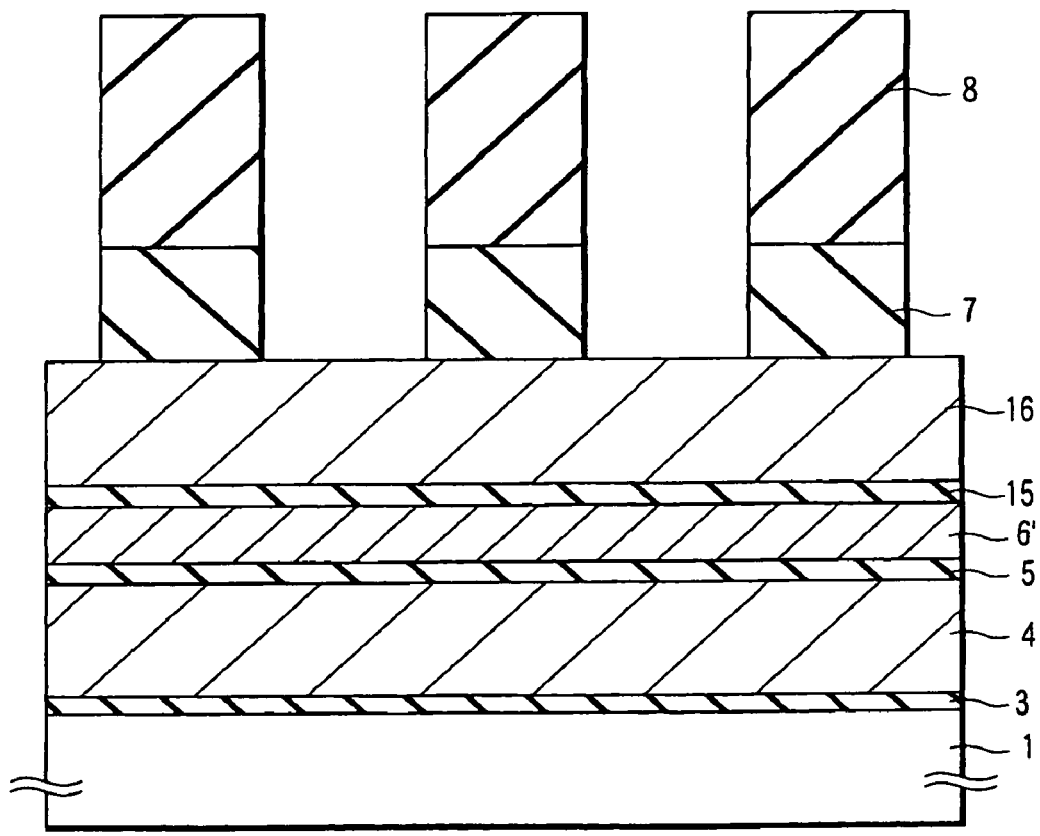
F I G. 14

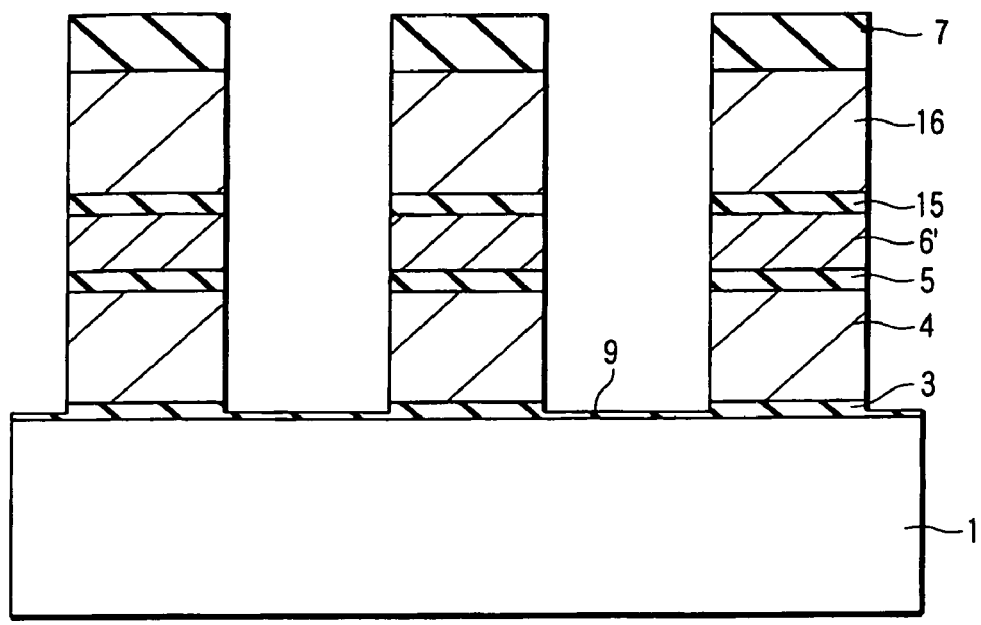
F I G. 15
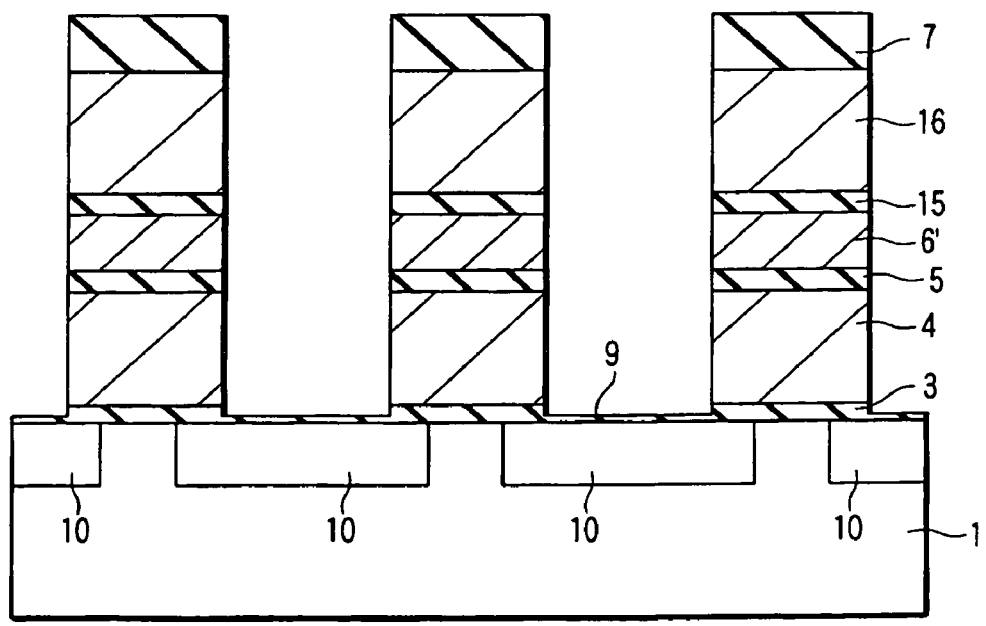
F I G. 16

SEMICONDUCTOR DEVICE AND METHOD FOR MANUFACTURING THE SAME

CROSS-REFERENCE TO RELATED APPLICATIONS

This application is a division of application Ser. No. 11/699,501, filed Jan. 30, 2007, now abandoned which is based upon and claims the benefit of priority from the prior Japanese Patent Application No. 2006-023851, filed Jan. 31, 2006, the entire contents of both of which are incorporated herein by reference.

BACKGROUND OF THE INVENTION

1. Field of the Invention

The present invention relates to a semiconductor device including a nonvolatile semiconductor memory such as a NAND flash memory and a method for manufacturing the semiconductor device.

2. Description of the Related Art

A nonvolatile semiconductor memory is one of the semiconductor memory devices. In recent years, the nonvolatile semiconductor device is in increasing demand as data storage device. NAND flash memory is known as typical electrically rewritable nonvolatile memory using floating gate (FG) electrode and control gate (CG) electrode.

As the CG electrode of the NAND flash memory, a stacked type electrode comprising a first electrode formed of polycrystalline silicon and a second electrode provided on the first electrode and formed of metal silicide (Jpn. Pat. Appln. KOKAI Publication No. 2-188969).

Device elements have been increasingly miniaturized in order to increase the storage capacity of NAND flash memory. The miniaturization of the device elements increases the aspect ratio of the device element structure. With the CG electrode of the stacked type, it is difficult to inhibit an increase in the aspect ratio of the CG electrode resulting from the miniaturization of the device elements. The reason is as mentioned below. Because the electrode formed of polycrystalline silicon has a higher resistance than the electrode formed of metal silicide, it requires thickening the electrode formed of metal silicide in order to suppress resistance increase caused by miniaturization of the device elements.

BRIEF SUMMARY OF THE INVENTION

According to an aspect of the present invention, there is provided a semiconductor device comprising: a semiconductor substrate; a first insulating film provided on the semiconductor substrate; a charge storage layer provided on the first insulating film; a second insulating film comprising a plurality of insulating films provided on the charge storage layer and comprising a nitride film as an uppermost layer; and a single-layer control gate electrode provided on the second insulating film and comprising metal silicide.

According to another aspect of the present invention, there is provided a semiconductor device comprising: a semiconductor substrate; a first insulating film provided on the semiconductor substrate; a charge storage layer provided on the first insulating film; a second insulating film provided on the charge storage layer; and a multilayer control gate electrode provided on the second insulating film and comprising a semiconductor film, a third insulating film whose an uppermost layer is a nitride film, and a metal silicide film provided on the third insulating film.

According to an aspect of the present invention, there is provided a method for manufacturing a semiconductor device comprising a nonvolatile semiconductor memory including a semiconductor substrate and a gate structure provided on the semiconductor substrate, the gate structure comprising an insulating film and a control gate electrode provided on the insulating film, the method comprising: forming an insulating film whose uppermost layer is a nitride film as the insulating film of the gate structure; forming a semiconductor film on the insulating film; processing the semiconductor film and the insulating film into a gate; forming a refractory metal film on an area including the semiconductor film; and forming a single-layer control gate electrode comprising a metal silicide film, the forming the control gate electrode comprising converting whole of the semiconductor film into a metal silicide film by heat treatment.

BRIEF DESCRIPTION OF THE SEVERAL VIEWS OF THE DRAWING

FIG. 5 is a cross-sectional view showing the method for manufacturing the NAND flash memory of the first embodiment following FIG. 4;

FIG. 6 is a cross-sectional view showing the method for manufacturing the NAND flash memory of the first embodiment following FIG. 5;

FIG. 11 is a cross-sectional view showing the method for manufacturing the NAND flash memory of the first embodiment following FIG. 10;

FIG. 12 is a sectional view showing a method for manufacturing a NAND flash memory in accordance with a second embodiment;

FIG. 13 is a cross-sectional view showing the method for manufacturing the NAND flash memory of the second embodiment following FIG. 12;

FIG. 14 is a cross-sectional view showing the method for manufacturing the NAND flash memory of the second embodiment following FIG. 13;

FIG. 15 is a cross-sectional view showing the method for manufacturing the NAND flash memory of the second embodiment following FIG. 14;

FIG. 16 is a cross-sectional view showing the method for manufacturing the NAND flash memory of the second embodiment following FIG. 15;

DETAILED DESCRIPTION OF THE INVENTION

Embodiments of the present invention will be described with reference to the drawings.

First Embodiment

Figure 1:
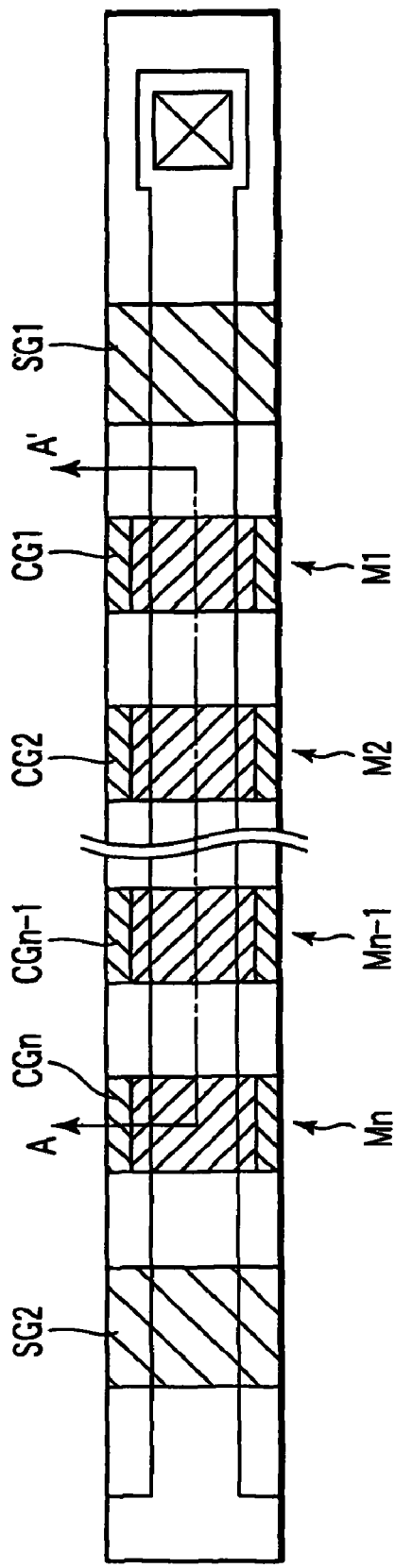
FIG. 1 is a plan view showing a part of a memory cell array in a NAND flash memory.
Figure 2:
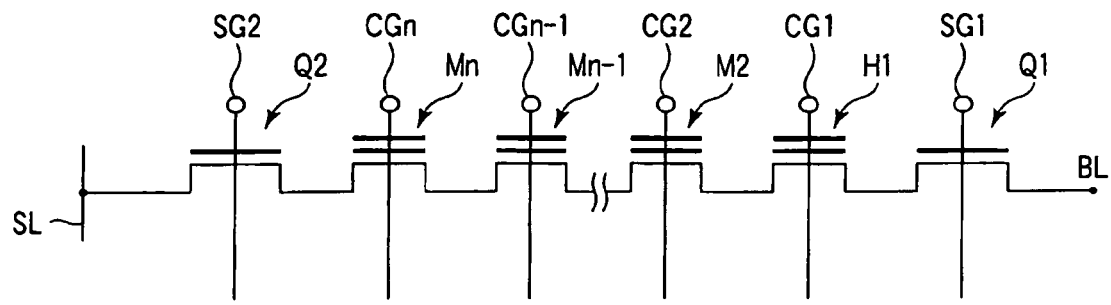
FIG. 2 is an equivalent circuit diagram of the memory cells shown in FIG. 1.
Figure 3:
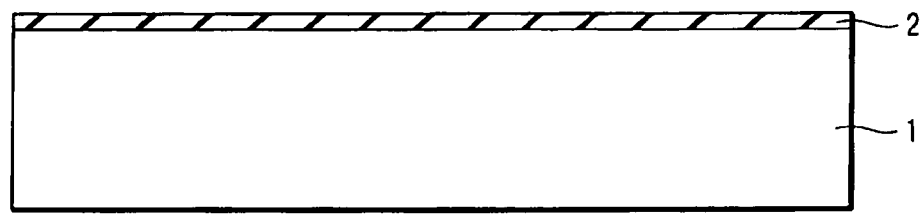
FIG. 3 is a sectional view showing a method for manufacturing a NAND flash memory in accordance with a first embodiment.
Figure 4:
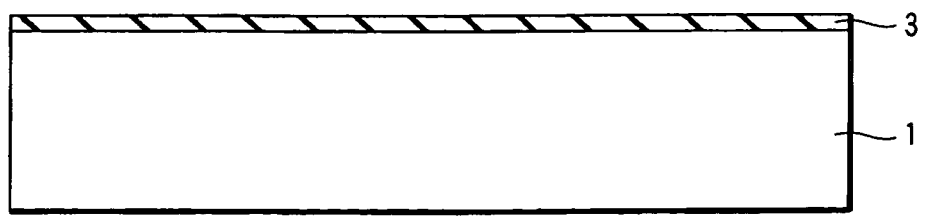
FIG. 4 is a cross-sectional view showing the method for manufacturing the NAND flash memory of the first embodiment following FIG. 3.

FIG. 1 is a plain view showing a part of a memory cell array in a NAND flash memory. FIG. 2 is an equivalent circuit diagram of the memory cell array shown in FIG. 1.

In FIGS. 1 and 2, M1, M2, . . . , Mn−1, and Mn denote a plurality of memory cells. The plurality of memory cells M1, M2, . . . , Mn−1, and Mn constitute a NAND cell by being connected together in series so that the adjacent memory cells share a source/drain. A drain terminal of the NAND cell is connected to a bit line BL via a select transistor Q1. A source terminal of the NAND cell is connected to a source line SL via a select transistor Q2.

Each of the memory cells M1, M2, . . . , Mn−1, and Mn comprises MOSFET including a double gate structure (in which a CG electrode is stacked on a FG electrode via an insulating film) on a silicon substrate via a gate insulating film. Select transistors S1 and S2 comprise MOSFETs. The MOSFETs are formed on the same well substrate.

CG electrodes of the memory cells M1, M2, . . . , Mn−1, and Mn are connected to respective CGi lines (word lines) (i=1, 2, . . . , n−1, and n) disposed in the row direction of the memory cell array. Gate electrodes of select transistors Q1 and Q2 are connected to select gate lines SG1 and SG2 disposed in the row direction of the memory cell array. Each word line has a connection pad at one end which is connected to a peripheral circuit via a metal interconnection; this end is formed on an isolation film.

FIG. 3-FIG. 11 are sectional views showing a method for manufacturing the NAND flash memory in accordance with the present embodiment. FIGS. 3 to 11 correspond to sectional views of the NAND flash memory taken along line A-A' in FIG. 1.

[FIG. 3]

A silicon oxide film 2 is formed on a silicon substrate 1 by thermal oxidation method.

[FIG. 4]

The silicon oxide film 2 is converted into an oxynitride film 3. The conversion from the silicon oxide film 2 into the oxynitride film is performed by nitriding treatment using nitriding agent, such as NO gas or ammonia gas. The oxynitride film 3 is generally called a tunnel insulating film. The tunnel insulating film is not limited to the oxynitride film 3, an oxide film may be used. As an example of such the oxide film, there is a silicon oxide film which is formed by radical oxidation method or thermal oxidation method.

[FIG. 5]

A polycrystalline silicon film 4 doped with phosphorous as impurity is formed on the oxynitride film 3 by CVD process. The silicon film 4 is processed into a FG electrode. Alternatively, an amorphous silicon film is first formed and then converted into a polycrystalline silicon film 4 by heat treatment.

An insulating film (inter-gate-electrode insulating film) 5 comprises as a stacked structure which has a nitride film as an uppermost layer is formed on the silicon film 4. The nitride film functions as a barrier against metal. The nitride film has a sufficient thickness (at least 0.5 mm) for blocking the formation of silicide. Too thick a nitride film constitutes a trap/ detrap site, which affects a charge holding characteristic. Thus, the thickness of the nitride film is preferably at most 3 nm.

The inter-gate-film insulating film 5 has the stacked structure comprising oxide film/nitride film/oxide film/nitride film and is called an ONON film. A process of forming an ONON film includes a step for forming an insulating film having a stacked structure of oxide film/nitride film/oxide film which is called an ONO film, and a step of forming a nitride film on the ONO film. These steps are carried out by LPCVD process. Further, the inter-gate-film insulating film 5 may be an SiO film whose uppermost layer includes Si, O and N, or an SiON film. Further, at the interface of the control gate electrode, the uppermost layer of the inter-gate-film insulating film may include at least bond of N and Si. The uppermost layer may include further bond of N, Si and O.

A silicon film 6 doped with phosphorous as impurity is formed on the inter-gate-electrode insulating film 5 by LPCVD process. The silicon film 6 is amorphous. The amorphous silicon film 6 is used because it can be converted into silicide more easily than polycrystalline silicon films. The silicon film 6 has a thickness of, for example, 125 nm. Before the formation of the silicon film 6, the surface of the nitride film located in the uppermost layer of the inter-gate-electrode insulating film 5 may be slightly oxidized but is preferably not oxidized. To achieve this, the inter-gate-electrode insulating film 5 and silicon film 6 are consecutively formed in the same chamber. A silicon nitride film 7 is formed on the silicon film 6 by LPCVD process.

[FIG. 6]

A resist pattern 8 is formed on the silicon nitride film 7. The pattern of the resist pattern 8 is transferred to the silicon nitride film 7 by etching the silicon nitride film 7. The silicon nitride film 7 is etched by using, for example, an RIE (Reactive Ion Etching) process with using the resist pattern 8 as a mask.

[FIG. 7]

The resist pattern 8 is removed, and the silicon film 6, inter-gate-electrode insulating film 5, silicon film 4, and oxynitride film 3 are etched in a vertical direction using the silicon nitride film 7 as a mask. These films 6 to 3 are etched by, for example, RIE process.

[FIG. 8]

Figure 7:
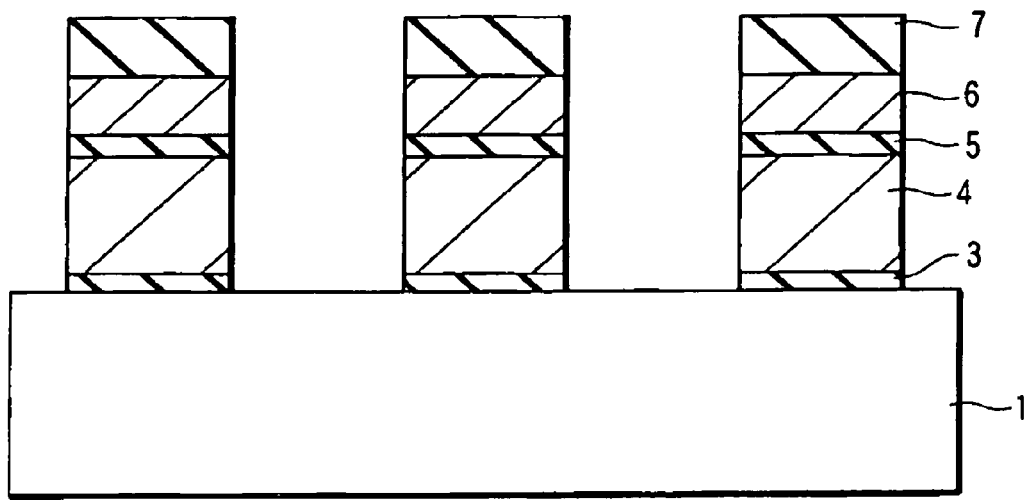
FIG. 7 is a cross-sectional view showing the method for manufacturing the NAND flash memory of the first embodiment following FIG. 6.
Figure 8:
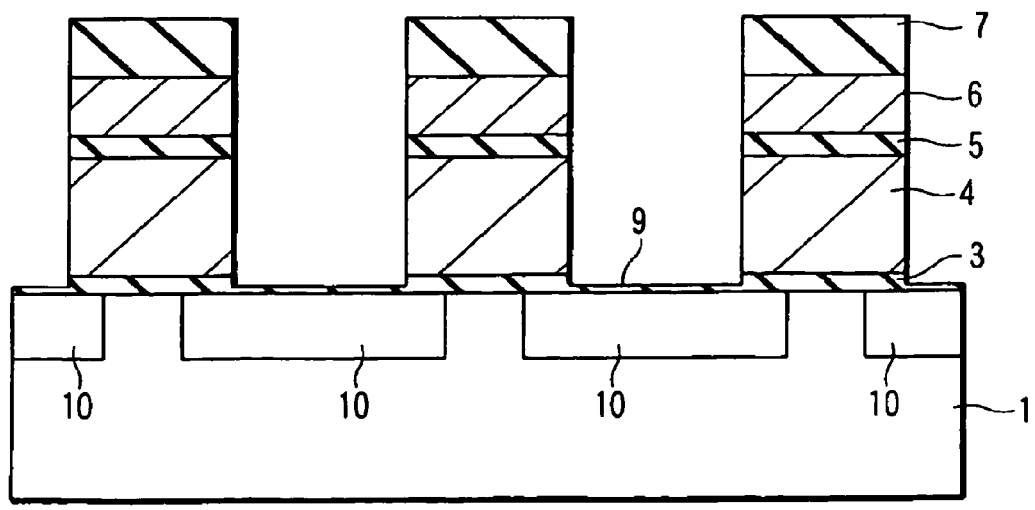
FIG. 8 is a cross-sectional view showing the method for manufacturing the NAND flash memory of the first embodiment following FIG. 7.
Figure 9:
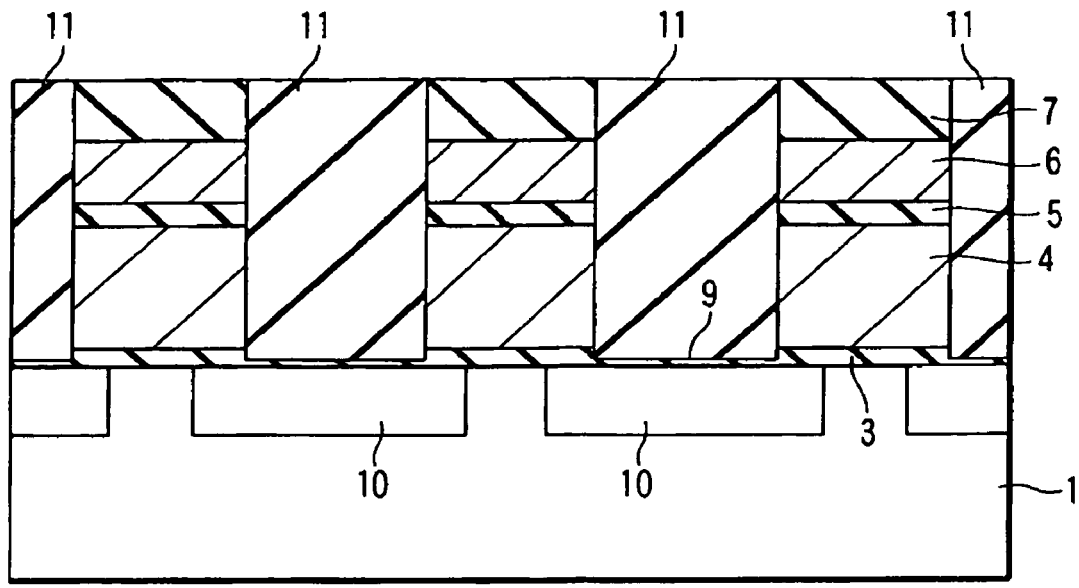
FIG. 9 is a cross-sectional view showing the method for manufacturing the NAND flash memory of the first embodiment following FIG. 8.
Figure 10:
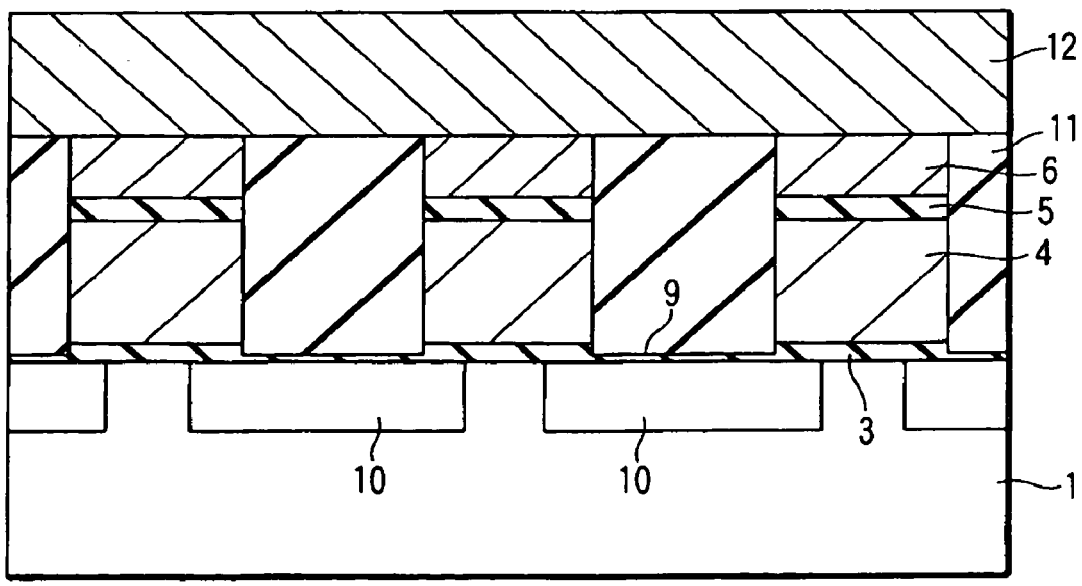
FIG. 10 is a cross-sectional view showing the method for manufacturing the NAND flash memory of the first embodiment following FIG. 9.
Figure 17:
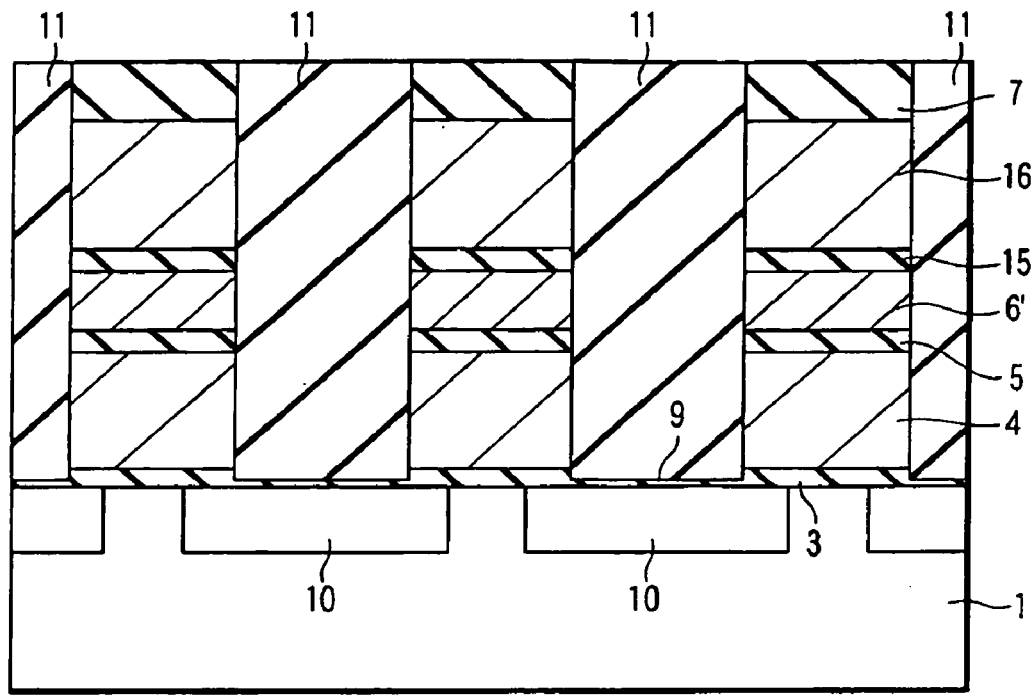
FIG. 17 is a cross-sectional view showing the method for manufacturing the NAND flash memory of the second embodiment following FIG. 16.
Figure 18:
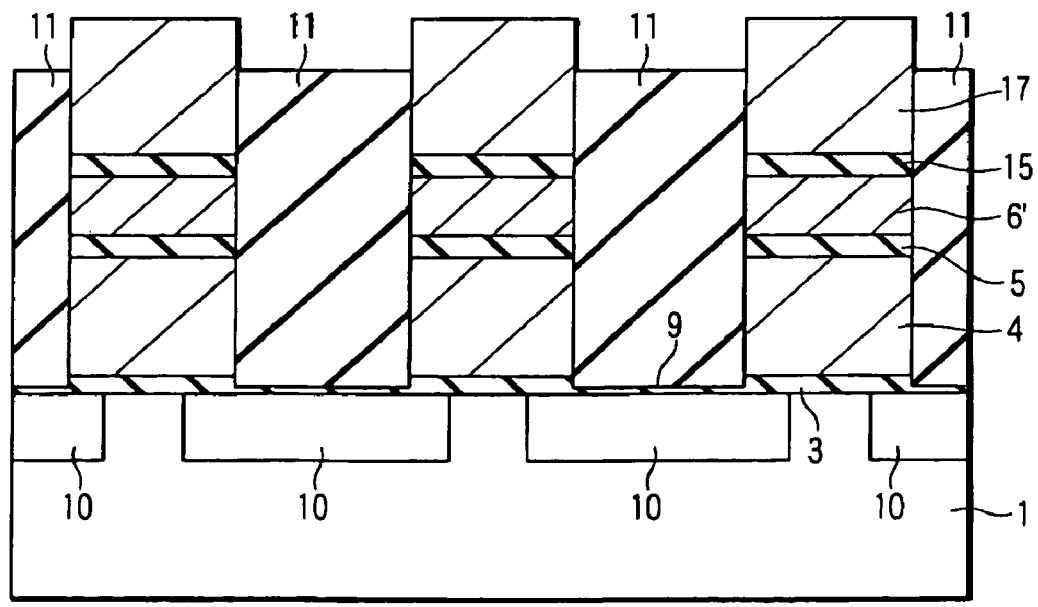
FIG. 18 is a cross-sectional view showing the method for manufacturing the NAND flash memory of the second embodiment following FIG. 17.

An oxidation process called post-oxidation is executed to recover from damage caused by etching in the step shown in FIG. 7. The post-oxidation forms a post-oxidized film 9 on the opened surface of silicon substrate 1, and sidewalls of silicon films 4 and 6. The source/drain areas 10 are formed by implanting ions into a surface of the silicon substrate 1 by ion implantation process, and then activating the implanted ions by thermal annealing. Shallow diffusion areas called extensions are also often formed. However, it is omitted for simplification.

[FIG. 9]

The area between the cells is filled with an insulating layer 11, and then the insulating layer upper than top surface of the silicon nitride film 7 is planarized. Specifically, a stacked film of a thermal oxide film, a silicon nitride film, and a BPSG film is used as the insulating film 11. The thermal oxide film, the silicon nitride film, and the BPSG film are sequentially formed so as to fill the area between the cells, thereafter, the entire surface is planarized by CMP (Chemical Mechanical Polishing) process.

[FIG. 10]

The silicon nitride film 7 is removed by etching. The insulating film 11 has a higher etching rate than the silicon nitride film 7. Thus, when the silicon nitride film 7 is etched, the insulating film 11 is also etched, the height of the insulating film 11 is lowered. A Co (cobalt) film 12 is deposited all over the surface by sputter process so as to fill a recess formed by removing the silicon nitride film 7. The Co film 12 has a thickness of, for example, 26 mm.

[FIG. 11]

The Co film 12 and silicon film 6 are reacted with each other by heat treatment, thereby the silicon film 6 is completely converted into a Co silicide film 13. Here, the Co silicide film is substantially silicidized down to the interface of the inter-gate-electrode insulating film 5. The CO silicide film 13 is used as the CG electrode. The unreacted Co film 12 is removed. Thereafter, the NAND flash memory is completed through a well-known process.

As shown in FIG. 11, the NAND flash memory of the present embodiment comprises the silicon substrate 1, the oxynitride film 3 provided on the silicon substrate 1 and serving as the tunnel insulating film, the silicon film 4 provided on the oxynitride film 3 and serving as the FG electrode, the inter-gate-electrode insulating film 5 provided on the silicon film 4 and having an nitride film as the uppermost layer, and the Co silicide film 13 provided on the inter-gate-electrode film 5 and serving as the single-layer control gate electrode comprising metal silicide.

According to the present embodiment, the formation of the Co silicide film 13 stops at the nitride film of the uppermost layer of the inter-gate-electrode insulating film 5, therefore, the whole of the silicon film 6 is silicidized with high controllability. Thereby, the silicide film thickness is uniformed. As the nitride film is the uppermost layer of the inter-gate-electrode insulating film, spikes and diffusion of Co are suppressed. Thereby, the degradation of the inter-gate-electrode insulating film 5 and oxynitride film (tunnel oxide film) 3 are suppressed.

In addition, according to the present embodiment, as the whole of the CG electrode is the Co silicide film 13, the height (aspect) of the CG electrode is reduced compared with the CG electrode comprising the silicon/metal silicide structure. Thereby, gate processing, inter-cell filling, and contact processing are easily performed.

Further, according to the present embodiment, as the Co silicide film 13 which is the CG electrode contacts with the nitride film of the uppermost layer of the inter-gate-electrode insulating film 5, barrier height between the CG electrode and the inter-gate-electrode insulating film increases compared with the CG electrode comprising the silicon/metal silicide structure. Thereby, leakage current from the CG electrode is reduced.

In addition, the ONON film is used as the inter-gate-electrode insulating film in the present embodiment, the inter-gate-electrode insulating film may be any insulating film comprising a single layer or multiple layers including at least one of an oxide film, a nitride film, an oxynitride film, a high dielectric metal oxide film, a high dielectric metal nitride film, and a high dielectric metal oxynitride film and having a nitride film as an uppermost layer. An example of the inter-gate-electrode film is an ONON film. Specifically, the high dielectric metal oxide film, high dielectric metal nitride film, and high dielectric metal oxynitride film each have a larger dielectric constant than an $SiO_2$ film and include at least one of Al, Hf, Si, O, and N.

Further, the Co silicide is used as metal silicide, the metal silicide may be any silicide including at least one refractory metal. Examples of the refractory metal include, for example, Ni, Co, and Pt.

Further, the present embodiment shows the method for manufacturing the NAND flash memory, the present embodiment exerts similar effects on MONOS (Metal-Oxide-Nitride-Oxide-Semiconductor) nonvolatile memories. The MONOS comprises ONO film layers (oxide film-nitride film-oxide film) between the Si substrate and control electrode (gate electrode). While the nitride film in the center of the ONO film layers is an insulator, there are large numbers of traps located in that layer and it can capture and store charge. This layer can be made to function as a charge storing means by injecting and rejecting charge from these traps. When the whole of the control electrode on the ONO film in the MONOS nonvolatile memory is converted into a metal silicide electrode by the method of the present embodiment, the similar effect as the present embodiment is obtained.

Jpn. Pat. Appln. KOKAI Publication No. 2-188969 describes that a nitride film is interposed under the metal silicide layer to reduce leakage current. However, this publication does not describe that the whole CG electrode is silicidized. Therefore, the lower interface of the metal silicide film have a high roughness, dispersion occurs in the thickness of the metal silicide films. These may be causes dispersion in resistance value of CG electrodes. Further, as spikes are formed along the grains of the polysilicon film and Co diffuses, the inter-gate-electrode insulating film or tunnel insulation is degraded.

Second Embodiment

FIG. 12-FIG. 18 are sectional views showing a method for manufacturing a NAND flash memory in accordance with a second embodiment of the present invention. In FIG. 12-FIG. 18, the same reference numerals as FIG. 3-FIG. 11 are given to designate portions corresponding to FIG. 3-FIG. 11, and the details are omitted.

[FIG. 12]

First, as is the case with the first embodiment, the oxynitride film 3, the polycrystalline silicon film 4, and the inter-gate-electrode insulating film 5 are formed on a silicon substrate 1. A polycrystalline silicon film 6' is formed on the inter-gate-electrode insulating film 5. Alternatively, an amorphous silicon film may be formed and then subjected to a thermal treatment or the like so as to be converted into a polycrystalline silicon film 6'. Here, the silicon film 6' has a thickness of 40 nm.

[FIG. 13]

An insulating film 15 is formed on the silicon 6'. The insulating film 15 is an SiO film including Si, O, and N, an SiN film, or an SiON film. The thickness of the insulating film 15 is at least 0.5 nm so as to enable the formation of silicide to be blocked. The thickness of the insulating film is at most 2 nm so as not to hinder the conductivity of the polycrystalline silicon film and silicide film. The insulating film 15 is formed by removing a native oxide film formed on a surface of the silicon film 6' by dilute fluoric acid treatment beforehand, thereafter, wet treatment is applied to the surface of the silicon film 6' using a solution added $H_2O_2$ or $O_3$. After the wet treatment, extremely small depth of surface of the insulating film 15 may be nitridized in a radial nitrogen atmosphere. An amorphous silicon film 16 doped with phosphorous as impurity is formed on the insulating film 15 by LPCVD process.

The silicon film 16 has a thickness of, for example, 125 nm. A silicon nitride film 7 is formed on the silicon film 16 by LPCVD process.

[FIG. 14]

A resist pattern 8 is formed on the silicon nitride film 7. The pattern of the resist pattern 8 is transferred to the silicon nitride film 7 by etching the silicon nitride film 7 using the resist pattern 8 as a mask.

[FIG. 15]

The resist pattern 8 is removed, and the silicon film 16, insulating film 15, silicon film 6', inter-gate-electrode insulating film 5, silicon film 4, and oxynitride film 3 are etched in a vertical direction using the silicon nitride film 7 as a mask. These films 3 to 6', 15, and 16 are etched by, for example, RIE process. Post-oxidation is executed to recover from damage caused by the etching, and then the post-oxidized film 9 is formed.

[FIG. 16]

The source/drain areas 10 are formed by implanting ions into the surface of the silicon substrate 1 by ion implantation process, and then activating the implanted ions by thermal annealing. The shallow diffusion areas called extensions are also often formed. However, it is omitted for simplification.

[FIG. 17]

The area between the cells is filled with the insulating film 11, and then, the entire surface is planarized.

[FIG. 18]

The silicon nitride film 7 is removed by etching, a Co film 12 having thickness, for example, 26 nm is deposited all over the surface by sputter process, thereafter, the Co film and silicon film 6 are reacted with each other by heat treatment, thereby the silicon film 16 is completely convert into a Co silicide film 17. The CO silicide film 17, insulating film 15 and silicon film 16 are used as the CG electrode. The CG electrode includes the insulating film 15, which does not hinder the electrode from functioning properly because of its thickness set as described above. As the insulating film 11 has a higher etching rate than the silicon nitride film 7, when the silicon nitride film 7 is etched, the insulating film 11 is also etched, the height of the insulating film 11 is lowered. Thereafter, a NAND flash memory is completed through a well-known process.

The NAND flash memory of the present embodiment comprises the silicon substrate 1 (semiconductor substrate), the oxynitride film 3 (first insulating film) provided on the silicon substrate 1 and serving as the tunnel insulating film, the polycrystalline silicon film 4 (charge storage layer) provided on the oxynitride layer 3 and serving as the FG electrode, the inter-gate-electrode insulating film 5 (second insulating film) provided on the silicon film 4, and a multilayer control gate electrode provided on the inter-gate-electrode insulating film 5 and including the silicon film 6' (semiconductor film) provided on the inter-gate-electrode insulating film 5, the insulating film 15 (third insulating film) provided on the silicon film 6' and including the nitride film as the uppermost layer, and the Co silicide film 17 (metal silicide film) provided on the insulating layer 15.

According to the present embodiment, the formation of the Co silicide film 17 stops at the insulating film 15, therefore, the whole of the silicon film 16 is silicidized with high controllability. Thereby, the silicide film thickness is uniformed. In addition, as the spikes and the diffusion of Co are suppressed, the degradation of the inter-gate-electrode insulating film 5 and oxynitride film (tunnel oxide film) 3 are suppressed.

Further, the Co silicide is used as metal silicide, the metal silicide may be any silicide including at least one refractory metal. Examples of the refractory metal include, for example, Ni, Co, and Pt.

Further, the present embodiment shows the method for manufacturing the NAND flash memory, the present embodiment exerts similar effects on MONOS nonvolatile memories. That is, the whole of the control electrode on an ONO film in a MONOS nonvolatile memory may be converted into an electrode of silicon/insulator/metal silicide structure by the method of the present embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device comprising a nonvolatile semiconductor memory including a semiconductor substrate and a gate structure provided on the semiconductor substrate, the gate structure comprising an insulating film and a control gate electrode provided on the insulating film, the method comprising:
    forming a first insulating film as the insulating film of the gate structure, the first insulating film including an uppermost layer, the uppermost layer being a nitride film;
    forming a semiconductor film on the insulating film;
    processing the semiconductor film and the first insulating film into a gate;
    forming a refractory metal film on an area including the semiconductor film; and
    forming a single-layer control gate electrode comprising a metal silicide film, the forming the control gate electrode comprising converting whole of the semiconductor film into the metal silicide film by heat treatment.

2. The method for manufacturing a semiconductor device according to claim 1, wherein the semiconductor film is amorphous.

3. The method for manufacturing a semiconductor device according to claim 1, wherein the first insulating film and the semiconductor film are formed in the same chamber.

4. The method for manufacturing a semiconductor device according to claim 1, wherein the first insulating film including the uppermost layer further includes a second insulating film, and the second insulating film includes at least one of an oxide film, a nitride film, an oxynitride film, a high-dielectric metal oxide film, a high-dielectric metal nitride film, and a high-dielectric metal oxynitride film.

* * * * *